United States Patent
Sarig (10) Patent No.: US 7,339,829 B2
(45) Date of Patent: Mar. 4, 2008

(54) ULTRA LOW POWER NON-VOLATILE MEMORY MODULE

(75) Inventor: Erez Sarig, Migdal Haemek (IL)

(73) Assignee: Tower Semiconductor Ltd., Migdal Haemek (IL)

(*) Notice: Subject to any disclaimer, the term of this patent is extended or adjusted under 35 U.S.C. 154(b) by 0 days.

(21) Appl. No.: 11/277,592

(22) Filed: Mar. 27, 2006

(65) Prior Publication Data

US 2007/0223282 A1 Sep. 27, 2007

(51) Int. Cl.
*G11C 11/34* (2006.01)
(52) U.S. Cl. ............................. 365/185.18; 365/185.23
(58) Field of Classification Search ........... 365/185.18, 365/185.23
See application file for complete search history.

(56) References Cited

U.S. PATENT DOCUMENTS 6,788,576 B2* 9/2004 Roizin ..................... 365/185.1
6,956,771 B2* 10/2005 Sarig et al. ............. 365/185.18
2003/0095461 A1* 5/2003 Merritt et al. .............. 365/226
2006/0056264 A1* 3/2006 Worley et al. ......... 365/230.06
2006/0250832 A1* 11/2006 Su et al. ........................ 365/1

* cited by examiner

*Primary Examiner*—Michael T Tran
(74) *Attorney, Agent, or Firm*—Bever, Hoffman & Harms, LLP; E. Eric Hoffman, Esq.

(57) ABSTRACT

An improved ultra-low power NVM module, which exhibits low power consumption and reduced layout area. An array of compact flash memory cells are programmed and erased in response to positive and negative boosted voltages. However, the compact flash memory cells are read using conventional supply voltages, thereby minimizing power consumption during a read operation. The ultra-low power NVM module of the present invention can be fabricated using conventional VLSI process steps. The ultra-low power NVM module of the present invention also allows simple operation in all modes (i.e., program, erase, read and standby).

21 Claims, 4 Drawing Sheets

ULTRA LOW POWER NON-VOLATILE MEMORY MODULE

FIELD OF THE INVENTION

The present invention relates to a non-volatile memory module that exhibits an ultra-low power requirement. Such a non-volatile memory module can be used, for example, in radio frequency identification (RFID) applications.

BACKGROUND OF THE INVENTION

Many applications, including RFID applications, require non-volatile memory (NVM) modules that exhibit ultra-low power and a small layout area. It would therefore be desirable to have such a NVM module.

SUMMARY

Accordingly, the present invention provides an improved ultra-low power NVM module, which exhibits low power consumption and reduced layout area. In accordance with one embodiment of the present invention, an array of compact flash memory cells are programmed and erased in response to positive and negative boosted voltages (while the supply voltage is 1.8 Volts to 2.2 Volts). However, the compact flash memory cells are read using conventional supply voltages (e.g., 1 Volt to 2.2 Volts), thereby minimizing power consumption during a read operation. That is, the architecture of the compact flash memory cells and the associated operating voltages allow the NVM module to operate in read mode without the use of charge pumps to boost the $V_{DD}$ supply voltage. In program and erase operations, power consumption is low due to the low memory cell current required for these operations (around 100 nA for each memory cell). In standby mode, each compact flash memory cell only consumes 2 nA.

Advantageously, the ultra-low power NVM module of the present invention can be fabricated using conventional VLSI process steps. The ultra-low power NVM module of the present invention also allows simple operation in all modes (i.e., program, erase, read and standby).

The present invention will be more fully understood in view of the following description and drawings.

DETAILED DESCRIPTION

Figure 1:
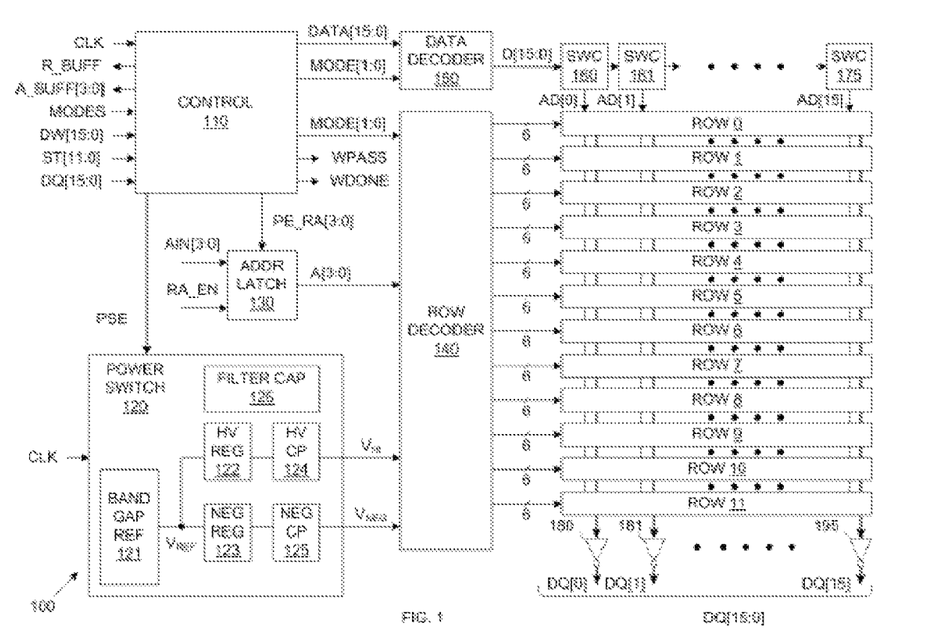
FIG. 1 is a block diagram of an ultra-low power non-volatile memory (NVM) module in accordance with one embodiment of the present invention.

FIG. 1 is a block diagram of an ultra-low power non-volatile memory (NVM) module 100 in accordance with one embodiment of the present invention. NVM module 100 includes control circuit 110, power switch 120, address latch 130, row decoder 140, data decoder 150, switch control circuits 160-175, output inverters 180-195 and NVM rows 0-11. In the described examples, each of NVM rows 0-11 includes sixteen compact flash memory cells, such that NVM module 100 includes a total of 192 compact flash memory cells (12 rows×16 columns). Other embodiments can include different numbers of rows and columns. In accordance with the described embodiments, the compact flash memory cells used in NVM module 100 are described in U.S. Pat. No. 6,788,576, which is incorporated herein by reference. In other embodiments, other compact flash memory cells may be used. In the described embodiments, NVM module 100 is fabricated using a 0.18 micron process and exhibits a layout area of about 0.095 mm².

The interface of control circuit 110 is configured to receive a clock signal (CLK), a mode signal (MODES), a write data signal DW[15:0], a state signal ST[11:0], and a data signal DQ[15:0], which is fed back from the output of NVM module 100 in order to verify if data was programmed/erased correctly to memory (program and erase verify). The CLK signal controls the timing of NVM module. The MODES signal identifies the operating mode of NVM module 100 as being a mode that requires the generation of boosted voltages (i.e., program or erase), or a mode that does not require the generation of boosted voltages (i.e., read or standby). The DW[15:0] signal is a data value to be written to one (or more) of the rows 0-11 of NVM module 100. The ST[11:0] signal identifies rows to be read from an external buffer (wherein the data read from the rows of the external buffer are subsequently written to NVM module 100).

Control circuit 110 provides a read buffer output signal R_BUFF and an address buffer output signal A_BUFF[3:0] to an external buffer. Data to be written to NVM module 100 is stored in an external buffer which has 12 rows of 16 bits each. The ST[11:0] signal indicates which rows of the external buffer are to be written to NVM module 100. Each bit of the ST[11:0] signal corresponds with a row in the external buffer (and a row in NVM module 100). An activated bit in the ST[11:0] signal indicates that the data in a corresponding row of the external buffer is to be written to the NVM module 100. Upon receiving the ST[11:0] signal with at least one activated bit, NVM module 100 erases the NVM rows 0-11 identified by the activated bit(s). This erase operation is described in more detail below.

After the erase operations are complete, NVM module 100 accesses the external buffer using the R_BUFF and A_BUFF[3:0] signals. When activated, the R_BUFF signal enables a read operation to the external buffer. The A_BUFF[3:0] signal identifies the row address to be read from the external buffer. The data stored in the row address identified by the A_BUFF[3:0] signal is read out of the external buffer and provided to NVM module 100 as the write data signal DW[15:0]. NVM module 100 then programs the retrieved write data signal DW[15:0] to the NVM row corresponding with the row address signal A_BUFF[3:0]. A program operation is performed for each row corresponding with an active bit in the ST[11:0] signal. The program operation is described in more detail below.

Control circuit 110 also provides a mode signal MODE[1:0] to data decoder 150 and row decoder 140. Control circuit 110 generates the MODE[1:0] signal in response to the MODES signal and the ST[11:0] signal. The MODE[1:0] signal identifies the current mode of NVM module 100. As described in more detail below, the MODE[1:0] signal has values of 'x0', '01' and '11' during read/standby, erase and program modes, respectively.

In addition, control circuit 110 provides a data signal DATA[15:0] to data decoder 150. The data signal DATA [15:0] is derived from the write data signal DW[15:0] (or the feedback data signal DQ[15:0]). Control circuit 110 also provides a power switch enable signal PSE, which is used to enable and disable power switch 120, and a program/erase row address signal PE_RA[3:0], which is provided to address latch 130. Address latch 130 also receives an external row address signal AIN[3:0] and a row address enable signal RA_EN. The row address enable signal RA_EN determines whether the program/erase row address PE_RA [3:0] or the external row address AIN[3:0] is stored in address latch 130. When the row address enable signal RA_EN is activated, the external row address AIN[3:0] is stored in address latch 130, and is provided to row decoder 140 as the row address signal A[3:0]. When the row address enable signal RA_EN is deactivated, the program/erase row address PE_RA[3:0] is stored in address latch 130, and is provided as the row address signal A[3:0]. In this manner, control circuit 110 can effectively bypass the external row address AIN[3:0] by causing the program/erase row address PE_RA[3:0] to be stored in address latch 130. In general, address latch 130 stores the row address associated with a program, erase or read operation until a subsequent operation is performed. This enables control circuit 110 to be disabled during the latter portions of read operations, thereby creating additional power savings in NVM module 100. Control circuit 110 also provides two additional output signals: WPASS, which transitions to a logic high state if erase and program operations are successfully performed, and WDONE, which transitions to a logic high state when erase and program operations are completed.

Power switch 120 includes band gap reference circuit 121, high voltage regulator 122, negative voltage regulator 123, high voltage charge pump 124, negative voltage charge pump 125 and filter capacitor 126. Band gap reference circuit 121 provides a reference voltage $V_{REF}$ to high voltage regulator 122 and negative voltage regulator 123. In general, band gap reference circuit 121 provides the reference voltage $V_{REF}$ in response to the band gap voltage of silicon in a manner known to those of ordinary skill in the art.

High voltage regulator 122 and negative voltage regulator 123 regulate the output voltages $V_{HI}$ and $V_{NEG}$ of high voltage charge pump 124 and negative charge pump 125, respectively. Regulating the output voltages of charge pumps 124 and 125 saves power in NVM module 100. Charge pumps 124 and 125 provide a positive boosted voltage $V_{HI}$ and a negative boosted voltage $V_{NEG}$, respectively, in response to a $V_{DD}$ supply voltage and the clock signal CLK. In the described embodiment, the $V_{DD}$ supply voltage has a value of about 1.8 Volts. When enabled, the high voltage charge pump 124 provides a positive boosted output voltage $V_{HI}$ of about +5.0 Volts. The negative voltage charge pump 125 provides a negative boosted output voltage $V_{NEG}$ of about −5.0 Volts, when enabled. Filter capacitor 126 smoothes variations in the $V_{DD}$ supply voltage and the boosted output voltages $V_{HI}$ and $V_{NEG}$. The $V_{HI}$ and $V_{NEG}$ boosted voltages are applied to row decoder 140. The negative boosted voltage $V_{NEG}$ is also applied to switch control circuits 160-175.

In one embodiment, charge pumps 124 and 125 are designed using Schottky diodes and MIM capacitors in order to minimize power consumption when these charge pumps are enabled. In addition, regulators 122 and 123 can be designed to use level shifters with defined bias current instead of resistor dividers, thereby minimizing layout area and power consumption.

Power switch 120 is enabled to generate the $V_{HI}$ and $V_{NEG}$ boosted voltages in response to a power switch enable signal (PSE) provided by control circuit 110. As described in more detail below, the $V_{HI}$ and $V_{NEG}$ voltages are only generated during program and erase modes (but not during read or standby modes), advantageously reducing the power requirements of NVM module 100.

As described above, control circuit 110 provides a data signal DATA[15:0] and a mode signal MODE[1:0] to data decoder 150. As described in more detail below, data decoder 150 provides a set of 16 data values D[15:0] to switch control circuits 160-175 in response to the DATA [15:0] and MODE[1:0] signals. Data values D[0], D[1], . . . D[15] are applied to switch control circuits 160, 161, . . . 175, respectively. As described in more detail below, switch control circuits 160-175 provide analog data signals AD[0: 15] in response to data values D[0:15], respectively. Each of switch control circuits 160-175 is coupled to a corresponding column of compact flash memory cells in NVM module 100. More specifically, each of switch control circuits 160-175 is coupled to a switch in each of rows 0-11. For example, analog data value AD[0] is applied to twelve switches (i.e., one switch in each of rows 0-11) in the first column of the NVM array.

Figure 2:
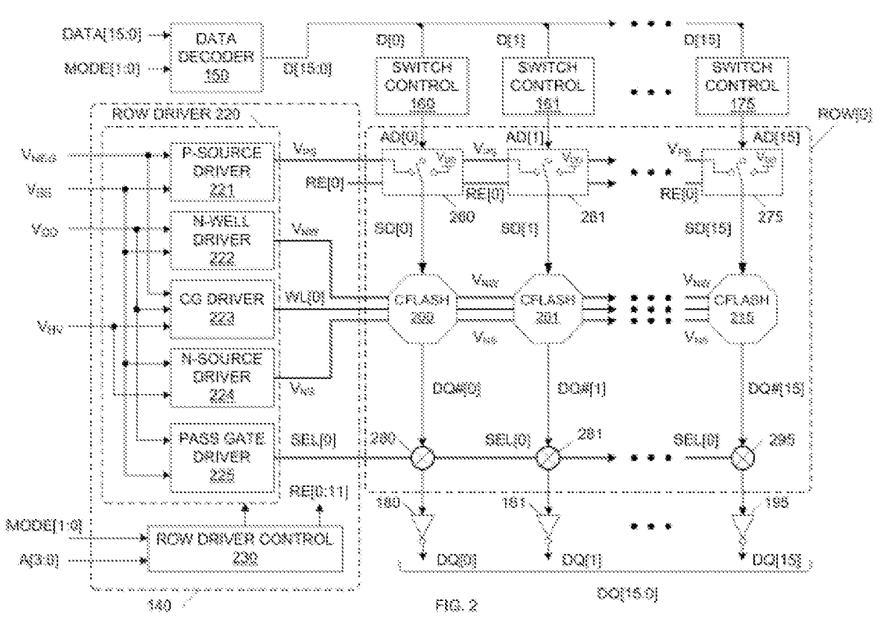
FIG. 2 is a block diagram illustrating a row of compact flash memory cells and associated control circuitry, which is included in the NVM module of FIG. 1 in accordance with one embodiment of the present invention.

As described in more detail below, row decoder 140 is configured to provide five access control signals to each of rows 0-11 in response to the row address signal A[3:0] and the MODE[1:0] signal. Each of the sixteen columns of memory cells in NVM module 100 is also coupled to a corresponding one of output inverters 180-195. Output inverters 180-195 are configured to receive a data signal DQ#[0:15] from an accessed row, and in response, provide the output data signal DQ[0:15]. Output inverters 180-195 are designed to have low power consumption FIG. 2 is a block diagram illustrating row 0 and the associated control circuitry within row decoder 140 in more detail. In the described embodiments, rows 1-11 are identical to row 0. Row 0 includes compact flash memory cells 200-215, p-source switches 260-275 and pass gates 280-295. Row decoder 140 includes row driver circuit 220 and row driver control circuit 230, which are used to control the operation of row 0. Each of rows 1-11 has a dedicated row driver circuit identical to row driver circuit 220. However, row driver control circuit 230 is capable of controlling each of the twelve row driver circuits.

Row driver circuit 220 includes p-source driver 221, n-well driver 222, control gate driver 223, n-source driver 224 and pass gate driver 225. These various driver circuits 221-225 are configured to receive the negative boosted voltage $V_{NEG}$, the positive boosted voltage $V_{HI}$, the positive supply voltage $V_{DD}$, and the ground supply voltage $V_{SS}$, as illustrated. As described in more detail below, driver circuits 221-225 selectively route the received voltages to row 0 under the control of row driver control circuit 230.

Each of p-source switches 260-275 is coupled to receive a p-source control voltage $V_{PS}$ from p-source driver 221. P-source switches 260 to 275 are controlled by analog data signals AD[0] to AD[15], respectively, the MODE[0] signal (not shown in FIG. 2) and a row enable signal RE[0] generated by row driver control circuit 230. As described in more detail below, analog data signals AD[0:15] each have a value of either $V_{SS}$ (0 Volts) or $V_{NEG}$ (−5 Volts). P-source switches 260 to 275 provide switched data values SD[0] to SD[15] to compact flash memory cells 200 to 215, respectively. Each of the switched data values SD[0:15] can have a voltage of $V_{DD}$ (1.8 Volts), $V_{NEG}$ (−5 Volts) or floating.

Each of compact flash memory cells 200-215 in row 0 is also coupled to receive a n-well control voltage $V_{NW}$ from n-well driver 222, a word line control voltage WL[0] from control gate driver 223, and an n-source control voltage $V_{NS}$ from n-source driver 224. In addition, each of compact flash memory cells 200-215 is also coupled to an associated pass gate circuit 280-295, respectively. Each of the pass gate circuits 280-295 is coupled to receive a select signal SEL[0] from pass gate driver 225. Each of the pass gate circuits 280-295 is also coupled to an input terminal of a corresponding one of output inverters 180-195, respectively. When the SEL[0] signal is activated, pass gate circuits 280-295 are enabled (turned on), thereby coupling compact flash memory cells 200-215 to the input terminals of inverters 180-195. When the SEL[0] signal is deactivated, pass gate circuits 280-295 are disabled (turned off), thereby de-coupling compact flash memory cells 200-215 from the input terminals of inverters 180-195.

Figure 3:
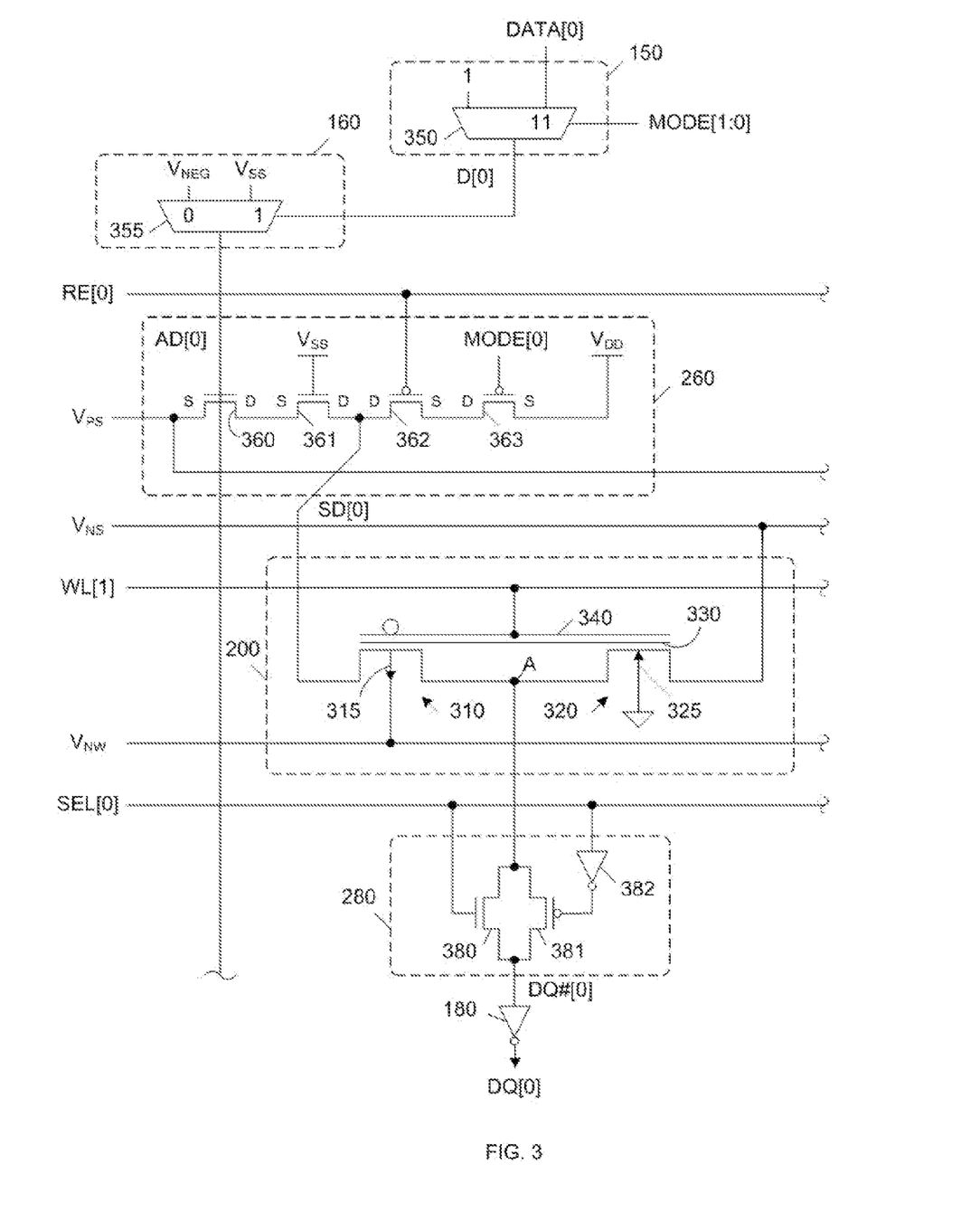
FIG. 3 is a circuit diagram that illustrates portions the ultra-low power NVM module of FIG. 1, including a data decoder, a switch control circuit, a p-source switch, a compact flash memory cell and a pass gate, in accordance with one embodiment of the present invention.

FIG. 3 is a circuit diagram that illustrated portions of data decoder 150, switch control circuit 160, p-source switch 260, compact flash memory cell 200 and pass gate circuit 280 in accordance with one embodiment of the present invention. The illustrated portion of data decoder 150 includes multiplexer 350, which selectively routes the DATA[0] signal or a logic "1" signal as the data signal D[0] in response to the MODE[1:0] signal. When the MODE[1:0] signal has a value of '11' (i.e., during a program operation), multiplexer 350 routes the DATA[0] signal as the data signal D[0]. When the MODE[1:0] signal has any other value (i.e., during read or erase operations), multiplexer 350 routes the logic "1" signal as the data signal D[0].

Switch control circuit 160 includes multiplexer 355, which routes the $V_{NEG}$ voltage or the $V_{SS}$ voltage as the analog data signal AD[0] in response to the data signal D[0] provided by data decoder 150. If the data signal D[0] has a logic "1" value, then multiplexer 355 routes the $V_{SS}$ voltage (0 Volts) as the analog data signal AD[0]. Conversely, if the data signal D[0] has a logic "0" value, then multiplexer 355 routes the $V_{NEG}$ voltage (−5 Volts) as the analog data signal AD[0].

P-source switch 260 includes n-channel pass gate transistors 360-361 and p-channel pass gate transistors 362-363. N-channel pass gate transistors 360-361 are fabricated in a p-type well region, which is coupled to receive the negative boosted voltage $V_{NEG}$. The p-type well region is located in a deep n-well region. N-channel transistor 360 has a gate coupled to receive the analog data signal AD[0], a source coupled to receive the $V_{PS}$ voltage, and a drain coupled to the source of n-channel transistor 361. The gate of n-channel transistor 361 is coupled to receive the $V_{SS}$ voltage. N-channel transistor 361 provides protection from high voltages.

P-channel pass gate transistors 362 and 363 are connected in series between the drain of n-channel pass gate transistor 361 and the $V_{DD}$ voltage supply. The gates of p-channel pass gate transistors are coupled to receive the row enable signal RE[0] and the MODE[0] signal. The switched data value SD[0] is provided at the commonly coupled drains of n-channel transistor 361 and p-channel transistor 362.

As described in more detail below, when compact flash memory cell 200 is being programmed, $V_{PS}$ is equal to the negative boosted voltage $V_{NEG}$, transistors 360-361 are turned on, and transistors 362-363 are turned off, such that the switched data value SD[0] has a voltage of about −5 Volts. When compact flash memory cell 200 is being read, transistors 362-363 are turned on, and transistors 360-361 are turned off, such that the switched data value SD[0] has a voltage of about $V_{DD}$ (e.g., 1 Volt to 2.2 Volts). Under all other conditions, one or more of transistors 360-361 are turned off and one or more of transistors 362-363 are turned off, such that switched data value SD[0] is in a floating state.

Compact flash memory cell 200 includes a p-channel field effect transistor (FET) device 310 and an n-channel FET device 320. The drains of FET devices 310 and 320 are commonly connected at node A. P-channel FET device 310 is formed in an n-well region 315, which is coupled to receive the n-well control voltage $V_{NW}$ from N-well driver 222. N-channel FET device 320 is formed in a p-type region 325, which is coupled to the ground supply voltage $V_{SS}$. The source of p-channel FET device 310 is coupled to receive the switched data signal SD[0] from p-source switch 260. The source of n-channel FET device 320 is coupled to receive the n-source control voltage $V_{NS}$ from n-source driver 224.

Within compact flash memory cell 200, p-channel FET device 310 and n-channel FET device 320 share a common floating gate electrode 330 and a common control gate 340. Thus, FET devices 310 and 320 are connected in an inverter configuration. Control gate 340 is coupled to receive the word line signal WL[0] provided by control gate driver 223. A variation of compact flash memory cell 200 is generally described in more detail in U.S. Pat. No. 6,788,576 to Roizin et al. (hereinafter, the '576 patent), which is hereby incorporated by reference. Compact flash memory cell 200 exhibits some differences with respect to the compact flash memory cell of the '576 patent. For example, n-channel FET device 320 is a native NMOS device having a low threshold voltage (e.g., about −0.5V), wherein the n-channel FET device of the compact flash memory cell of the '576 patent is a high threshold voltage device, having a relatively thick gate dielectric. The low threshold voltage of n-channel FET device 320 advantageously provides an initial trip point for the inverter configuration of about −0.5V (when compact flash memory cell 200 is in an erased state). In addition, the coupling ratio of compact flash memory cell 200 is approximately 80%, which is higher than the coupling ratio of the compact flash memory cell of the '576 patent.

Pass gate circuit 280 includes n-channel transistor 380, p-channel transistor 381, and inverter 382. The sources of transistors 380 and 381 are coupled to node A, and the drains of transistors 380 and 381 are coupled to the input of output inverter 180. The gate of n-channel transistor 380 is coupled to receive the select signal SEL[0] from pass gate driver 225, and the gate of p-channel transistor 381 is coupled to receive the inverse of the select signal SEL[0] from inverter 382.

NVM module 100 operates as follows in accordance with one embodiment of the present invention. As described herein, floating gate 330 is "programmed" when it stores a net negative charge, and is "erased" when the net negative charge is removed or floating gate 330 stores a net positive charge. In particular, floating gate 330 is "programmed" when it stores a negative charge that is sufficient to turn on p-channel FET device 310 during read operations, even when a predetermined logic high word line voltage WL[0] (e.g., +1.8 Volts) is transmitted to control gate 340 (i.e., the logic high voltage applied to the control gate 340 is insufficient to overcome the negative voltage stored on floating gate 330 and turn on n-channel FET device 320). Similarly, floating gate 330 is "erased" when the net negative charge is removed from the control gate 340, or this control gate stores a net positive charge that is sufficient to turn on n-channel FET device 320 during read operations when a logic high word line voltage WL[0] is transmitted to control gate 34 (and is also sufficiently positive to prevent p-channel FET device 310 from turning on when the word line voltage WL[0] has a logic low voltage of 0 Volts).

The erase, program, read and standby modes of NVM module 100 will now be described in more detail.

Erase Mode

The erase mode is described in connection with an erase operation of row 0, which includes compact flash memory cell 200. It is understood that the other compact flash memory cells 201-215 in row 0 are erased at the same time (and in the same manner) as compact flash memory cell 200.

An erase operation is initiated by the control circuit 110 in response to a logic '1' bit present in the ST[11:0] signal, along with logic '0' values stored in the corresponding row of the external buffer. For example, NVM row 0 will be erased if the ST[0] signal has a logic '1' value, and row [0] of the external buffer is programmed to store 16 logic '0' bits. In response to the logic '1' state of the ST[0] signal, control circuit 110 provides a MODE[1:0] signal having a value of '01', which is provided to row decoder 140 and data decoder 150. The '01' value of the MODE[1:0] indicates that an erase operation will be performed. The control circuit 110 also activates the power switch enable signal PSE in response to the MODES signal, thereby causing power switch 120 to begin generating the positive and negative boosted voltages $V_{HI}$ and $V_{NEG}$.

Upon detecting the logic '1' state of the ST[0] signal, control circuit 110 provides a program/erase row address PE_RA[3:0] that identifies NVM row 0 in response to the logic '1' state of the ST[0] signal. This program/erase row address PE_RA[3:0] is stored to address latch 130. As described below, address latch 130 only stores the external row address AIN[3:0] when the row address enable signal RA_EN is activated (during a read operation).

Row address latch 130 provides the stored program/erase row address PE_RA[3:0] to row decoder 140 as row address signal A[3:0]. In the described example, row address signal A[3:0] identifies NVM row 0 as the row to be erased.

Within row decoder 140, the row driver control circuit 230 identifies the current access as an erase operation to NVM row 0 in response to the received row address signal A[3:0] and the MODE[1:0] signal. In response, row driver control circuit 230 activates a row enable signal RE[0] associated with row 0, by driving this signal to a logic low state. Row driver control circuit 230 maintains the row enable signals RE[1:11] associated with non-selected rows 1-11 in a logic high state (which is the default state for non-selected rows in the described embodiments). Row driver control circuit 230 also controls drivers 221-225 in the following manner.

P-source driver 221 is controlled to pull down the p-source control voltage $V_{PS}$ down to the ground supply voltage $V_{SS}$ (0 Volts). Data decoder 150 routes data signals D[15:0] having all logic '1' values in response to the '01' state of the MODE[1:0] signal. The logic '1' state of the D[0] signal causes the switch control circuit 160 to provide an analog data signal AD[0] having a voltage equal to the $V_{SS}$ supply voltage (0 Volts). Within p-source switch 260, the 0 Volt analog data signal AD[0], along with the 0 Volt p-source control voltage $V_{PS}$, causes transistor 360 to turn off. Note that transistor 361 is also turned off at this time. Also within p-source switch 260, the logic '1' state of the MODE[0] signal causes transistor 363 to turn off. As a result, p-source switch 260 leaves the switched data signal SD[0] in a floating state (even though row enable signal RE[0] has a logic low state). At this time, the p-type source region of each compact flash memory cell in NVM module 100 is in a floating state.

N-well driver 222 is controlled to pull down the n-well bias voltage $V_{NW}$ down to the ground supply voltage $V_{SS}$. Thus, the n-well region 315 is held at 0 Volts. Each of NVM rows 0-11 has a corresponding n-well region (e.g., n-well region 315 is shared by each of the compact flash memory cells 200-215 in NVM row 0). In non-selected NVM rows 1-11, the corresponding n-well drivers are controlled to drive the associated n-well bias voltages to the $V_{DD}$ supply voltage.

Control gate driver 223 is controlled to route the negative boosted voltage $V_{NEG}$ (i.e., −5 Volts) as the word line voltage WL[0]. In non-selected NVM rows 1-11, the corresponding control gate drivers are controlled to apply the $V_{DD}$ supply voltage to the associated word lines WL[1:11].

N-source driver 224 is controlled to route the positive boosted voltage $V_{HI}$ (i.e., 5 Volts) as the n-source control voltage $V_{NS}$. Thus, the n-type source of n-channel FET device 320 (and the n-type sources of the n-channel FET devices in compact flash memory cells 201-215) is held at a voltage of about 5 Volts. In non-selected NVM rows 1-11, the corresponding n-source drivers are controlled to pull down the associated n-source voltages to the $V_{SS}$ supply voltage.

Pass gate driver 225 is controlled to pull down the select signal SEL[0] to the ground supply voltage $V_{SS}$. Thus, within pass gate circuit 280, pass gate transistors 380-381 are turned off, and node A of compact flash memory cell 200 is floating. In non-selected NVM rows 1-11, the corresponding pass gate drivers are also controlled to pull the select signals SEL[1:11] down to the ground supply voltage $V_{SS}$.

Under these conditions, electrons are removed from floating gate 330. That is, the high erase voltage (~10 Volts) introduced across the floating gate 330 by the low voltage on control gate 340 (−5 Volts) and the high voltage on the source of n-channel FET device 320 (5 Volts) is sufficient to cause band-to-band tunneling of electrons from the floating gate 330 to the n-type source region of n-channel FET device 320 (as well as band-to-band tunneling of holes to floating gate 330 in the opposite direction), thereby imparting a positive or neutral charge to floating gate 330. Note that all of the compact flash memory cells 200-215 in NVM row 0 are simultaneously erased during the erase operation.

The voltages applied to the compact flash memory cells in the non-selected NVM rows 1-11 are not sufficient to cause band-to-band tunneling in these cells, as the compact flash memory cells in non-selected NVM rows 1-11 do not receive the boosted voltages $V_{HV}$ or $V_{NEG}$. As a result, the compact flash memory cells in NVM rows 1-11 are not erased. As will become apparent in view of the subsequent disclosure, during the erase mode, the compact flash memory cells in non-selected rows are maintained in the same state as the compact flash memory cells in non-selected rows during the read mode.

If more than one of the ST[11:0] signals has a logic '1' value, then the erase mode is sequentially entered for each of the NVM rows having an associated ST signal with a logic '1' value. After the erase mode has been completed for each NVM row having an associated ST[11:0] signal with a logic '1' value, processing proceeds to the program mode, which is described below.

Program Mode

The program mode is entered after the erase mode has been completed for all NVM rows identified by the ST[11:0]

signal. The program mode is described in connection with the programming of compact flash memory cell 200. It is understood that the other compact flash memory cells 201-215 in NVM row 0 are programmed at the same time (and in the same manner) as compact flash memory cell 200 (provided that the switch control circuits 161-175 select these compact flash memory cells 201-215 for programming).

The program mode is initiated by control circuit 110 in response to one or more logic '1' bits in the ST[11:0] signal. More specifically, a logic '1' bit in the ST[11:0] signal initiates the above-described erase mode as described above, followed by the program mode. During the erase mode, all of the compact flash memory cells in the rows associated with the logic '1' bits of the ST[11:0] signal are erased (as described above for the Erase Mode). In the program mode, control circuit 110 retrieves a write data value DW[15:0] from each row of the external buffer identified by an associated logic '1' bit in the ST[11:0] signal. Each write data value DW[15:0] retrieved from the external buffer typically includes one or more logic '1' bits, which must be written to the selected NVM row. During the program mode, the write data values DW[15:0] retrieved from the external buffer are written to rows of NVM module 100 associated with the logic '1' bits of the ST[11:0] signal. If control circuit 110 determines that a write data value DW[15:0] retrieved from the external buffer includes all logic '0' bits, then the program operation to the associated NVM row can be skipped.

Control circuit 110 initiates the program mode after the erase mode is complete. Control circuit 110 initially retrieves a write data value DW[15:0] from a row of the external buffer identified by the ST[11:0] signal. In the described example, write data bit DW[0] has a logic '1' value. Control circuit 110 stores retrieved write data value DW[15:0].

Control circuit 110 also writes a program/erase row address PE_RA[3:0] to address latch 130, wherein the program/erase row address identifies the NVM row to be programmed (e.g., NVM row 0). Control circuit 110 also enables the power switch circuit 120 by activating the power switch enable signal PSE, and controls the MODE[1:0] signal to have a '11' value.

Control circuit 110 provides the write data value DW[15:0] retrieved from the external buffer to data decoder 150 as the data signal DATA[15:0]. Data decoder 150 routes the data signal DATA[15:0] in response to the logic '11' state of the MODE[1:0] signal, thereby providing data signals D[0:15] to switch control circuits 160-175, respectively. As described above in connection with FIG. 3, these data signals D[0:15] are used to select analog data signals AD[0:15] within switch control circuits 160-175.

For example, within data decoder 150, multiplexer 350 routes the data signal DATA[0] to switch control circuit 160 as the data signal D[0]. In the described example, the DATA[0] (and therefore the D[0] signal) has a logic '1' state. Within switch control circuit 160, multiplexer 355 routes the $V_{SS}$ voltage as the analog data signal AD[0] in response to the logic '1' state of data signal D[0].

Within row decoder 140, the row driver control circuit 230 identifies the current access as a program operation to row 0 in response to the received row address signal A[3:0] and the logic '11' state of the MODE[1:0] signal. Row driver control circuit 230 maintains the row enable signals RE[1:11] in the non-selected NVM rows 1-11 in the default logic high state. As will become apparent in view of the subsequent disclosure, the logic low state of the row enable signal RE[0] provides protection for p-channel device 363 from voltage violations when the switched data signal SD[0] has a voltage equal to the negative boosted voltage $V_{NEG}$ (−5 Volts). Row driver control circuit 230 also controls drivers 221-225 in the following manner.

P-source driver 221 is controlled to route the negative boosted voltage $V_{NEG}$ (−5 Volts) as the p-source control voltage $V_{PS}$. As described above, the logic '1' state of the DATA[0] signal causes the switch control circuit 160 to provide an analog data signal AD[0] having a voltage equal to the $V_{SS}$ supply voltage (0 Volts). Within p-source switch 260, the 0 Volt analog data signal AD[0] causes n-channel transistors 360 and 361 to turn on, thereby causing the p-source control voltage $V_{PS}$ (−5 Volts) to be routed to the source of p-channel FET device 310 as the switched data signal SD[0]. Note that logic '1' state of the MODE[0] signal causes p-channel transistor 363 to turn off, thereby isolating the switched data signal SD[0] from the $V_{DD}$ supply voltage. In non-selected NVM rows 1-11, the corresponding p-source drivers are controlled to pull down the associated p-source control voltages to the $V_{SS}$ supply voltage.

N-well driver 222 is controlled to pull the n-well bias voltage $V_{NW}$ down to $V_{SS}$ in the selected NVM row (e.g., NVM row 0), thereby reducing the voltage drop across the diode formed by p-type source of p-channel FET device 310 and the n-well region 315. In non-selected NVM rows 1-11, the corresponding n-well drivers are controlled to drive the associated n-well bias voltages to the $V_{DD}$ supply voltage.

Control gate driver 223 is controlled to route the positive boosted voltage $V_{HV}$ (i.e., 5 Volts) as the word line voltage WL[0]. In non-selected NVM rows 1-11, the corresponding control gate drivers are controlled to apply the $V_{DD}$ supply voltage to the associated word lines WL[1:11].

N-source driver 224 is controlled to route the $V_{SS}$ supply voltage (i.e., 0 Volts) as the n-source control voltage $V_{NS}$. Thus, the n-type source of n-channel FET device 320 (and the n-type sources of the n-channel FET devices in compact flash memory cells 201-215) is held at a voltage of about 0 Volts. In non-selected NVM rows 1-11, the corresponding n-source drivers are also controlled to pull down the associated n-source voltages to the $V_{SS}$ supply voltage.

Pass gate driver 225 is controlled to pull down the select signal SEL[0] to the ground supply voltage $V_{SS}$. Thus, within pass gate circuit 280, pass gate transistors 380-381 are turned off, and node A of compact flash memory cell 200 is floating. In non-selected NVM rows 1-11, the corresponding pass gate drivers are also controlled to pull the select signals SEL[1:11] down to the ground supply voltage $V_{SS}$.

Under these conditions, electrons are injected into floating gate 330 of NVM cell 200. That is, the high program voltage (~10 Volts) introduced across the floating gate 330 by the high voltage on control gate 340 (5 Volts) and the low voltage on the source of p-channel FET device 310 (−5 Volts) is sufficient to cause band-to-band tunneling of electrons from the p-type source region of p-channel FET device 310 to the floating gate 330 (as well as band-to-band tunneling of holes from floating gate 330 in the opposite direction), thereby imparting a negative charge to floating gate 330.

Note that if the data signal DATA[0] has a logic '0' state instead of a logic '1' state, the analog data signal AD[0] will have a voltage equal to the negative boosted voltage $V_{NEG}$. Under these conditions, n-channel transistor 360 does not turn on, thereby leaving the switched data signal SD[0] in a floating state. As a result, the voltage introduced across the floating gate 330 would be insufficient to cause band-to-band tunneling of electrons into floating gate 330. Thus, the charge on floating gate 330 would remain in the positive or neutral state previously obtained during the erase operation (i.e., compact flash memory cell 200 would remain in an erased state).

The voltages applied to the compact flash memory cells in the non-selected NVM rows 1-11 are not sufficient to cause band-to-band tunneling in these cells, as the compact flash memory cells in non-selected NVM rows 1-11 do not receive the boosted voltages $V_{HV}$ or $V_{NEG}$. As a result, none of the compact flash memory cells in NVM rows 1-11 are programmed. As will become apparent in view of the subsequent disclosure, during the program operation, the compact flash memory cells in non-selected rows are maintained in the same state as the compact flash memory cells in non-selected rows during the read mode.

In the foregoing manner, selected bits in a row of compact flash memory cells are programmed by enabling a negative programming voltage to be applied to the source of a p-channel FET device in the compact flash memory cell.

A program operation, similar to the program operation described above for NVM row 0, is then performed for each row of NVM cells identified by the ST[11:0] signal. Thus, if NVM rows 0, 4 and 7 were sequentially erased during the erase mode, then NVM rows 0, 4 and 7 are sequentially programmed in the program mode.

After the rows identified by the ST[11:0] have been programmed, a verify operation is performed. In this verify operation, control circuit 110 performs a read operation (as described in more detail below) to each of the programmed NVM rows. The data values DQ[0:15] read from each of the programmed NVM rows are provided to control circuit 110, which checks whether all of the bits of the programmed NVM rows were properly written. If control circuit 110 determines that all of the bits of the programmed NVM rows were properly written, then control circuit 110 activates the WPASS signal and the WDONE signal to logic high states, thereby indicating that the program operations were successful. However, if control circuit 110 determines that one or more of the bits of the programmed NVM rows were not properly written, then control circuit 110 activates the WDONE signal to a logic high state (indicating that the program operations were completed), but keeps the WPASS signal de-activated at a logic low state (indicating that at least one of the program operations was not successfully completed). In this case, control circuit 110 can be configured to perform any failed erase or program operation again.

In the described embodiment, each program operation has a 10 millisecond maximum access time. It is anticipated that at least 1000 program cycles may be performed by NVM module 100, with a data retention time of at least 10 years at 70° C. The required programming current for 16-bits is about 9 microAmps at 2 Volts and a temperature of 25° C. The required programming current for all 192-bits is about 15 microAmps at 2 Volts and a temperature of 25° C. In one embodiment, the CLK signal is selected to enable program operations to be performed at a frequency of 2 MHz.

The use of compact flash memory cell 200 facilitates low power program and erase operations, which implement band-to-band tunneling (BBT) injection. Because BBT injection is a relatively low voltage process, standard CMOS gate oxide can be used in FET devices 310 and 320. Accordingly, NVM module 100 can be embedded in a CMOS device.

Read Mode

During a read operation, the electric fields of floating gate 330 and control gate 340 are superimposed, and determine which portion of compact flash memory cell 200 (i.e., p-channel FET device 310 or n-channel FET device 320) is enabled (i.e., turned on). In each read operation, one row of compact flash memory cells is selected and all cells in this row operate as inverters, each driving an output inverter. After the read operation is complete, the selected row remains active due to the fact that the read address is stored in address latch 130. Both control circuit 110 and power switch block 120 are disabled during this phase of the read operation, thereby minimizing power consumption during the read operation.

The read mode is described in connection with a read operation of compact flash memory cell 200. It is understood that the other compact flash memory cells 201-215 in row 0 are read at the same time (and in the same manner) as compact flash memory cell 200.

To initiate a read operation, an accessing device de-activates the MODES signal, activates the external row address enable signal RA_EN, and provides a row address AIN[3:0] that identifies the row to be read. Control circuit 110 detects the de-activated state of the MODES signal to determine that the current operation is a read operation. In response to the deactivated MODES signal, control circuit 110 provides a MODE[1:0] signal having a value of '00' (or '10'). Control circuit 110 also de-activates the power switch enable signal PSE in response to the de-activated MODES signal, thereby disabling power switch 120. When disabled, power switch 120 does not generate the positive and negative boosted voltages $V_{HI}$ and $V_{NEG}$. Instead, the output of high voltage charge pump is pulled to the $V_{DD}$ supply voltage, and the output of negative voltage charge pump 125 is pulled to the $V_{SS}$ supply voltage. One manner of accomplishing this is described in U.S. Pat. No. 6,956,771 to Sarig et al. Controlling power switch 120 in this manner minimizes power consumption.

Address latch 130 stores the external row address AIN[3:0] in response to the activated row address enable signal RA_EN. Address latch 130 provides the row address AIN[3:0] to row decoder 140 as the address signal A[3:0].

Within row decoder 140, the row driver control circuit 230 identifies the current access as a read operation to row 0 in response to the received row address signal A[3:0] and the logic '00' (or '10') state of the MODE[1:0] signal. In response, row driver control circuit 230 activates a row enable signal RE[0] associated with row 0, by driving this signal to a logic low state. Row driver control circuit 230 maintains the row enable signals RE[1:11] in non-selected rows 1-11 in their default logic high states. Row driver control circuit 230 also controls drivers 221-225 in the following manner.

P-source driver 221 is controlled to provide a p-source control voltage $V_{PS}$ equal to the $V_{SS}$ supply voltage (0 Volts). Data decoder 150 provides data signals D[15:0] having all logic '1' values in response to the '00' state of the MODE[1:0] signal. The logic '1' state of the D[0] signal causes the switch control circuit 160 to provide an analog data signal AD[0] having a voltage equal to the $V_{SS}$ supply voltage (0 Volts). Within p-source switch 260, the 0 Volt analog data signal AD[0], along with the 0 Volt p-source control voltage $V_{PS}$, causes transistor 360 to turn off. Note that transistor 361 is also turned off at this time. Also within p-source switch 260, the logic '0' state of the MODE[0] signal causes p-channel transistor 363 to turn on. In addition, the logic low state of the activated row enable signal RE[0] causes p-channel transistor 362 to turn on. As a result, p-source switch 260 pulls the switched data signal SD[0] up to the $V_{DD}$ supply voltage through turned on transistors 362-363. Note that within the selected NVM row 0, all of the switched data signals SD[0:15] are pulled up to the $V_{DD}$ supply voltage during the read operation, such that the p-type source region of each compact flash memory cell 200-215 in row 0 is held at the $V_{DD}$ supply voltage. The p-type source region of the compact flash memory cells in the non-selected rows 1-11 of NVM module 100 are held in a floating state (because the deactivated row enable signals RE[1:11] associated with these non-selected rows have logic '1' states, thereby turning off the associated p-channel transistors in the corresponding p-source switches).

N-well driver 222 and control gate driver 223 are controlled to route the $V_{DD}$ supply voltage (e.g., 1.8 Volts) as the n-well bias voltage $V_{NW}$ and the word line signal WL[0], respectively. In non-selected rows 1-11, the associated n-well drivers are controlled to provide the $V_{DD}$ supply voltage as the n-well bias voltage $V_{NW}$. Similarly, in non-selected rows 1-11, the associated control gate drivers are controlled to route the $V_{DD}$ supply voltage as the word line signals WL[1-15].

N-source driver 224 is controlled to pull the n-source bias voltage $V_{NS}$ down to the ground supply voltage $V_{SS}$, such that the source of n-channel FET device 320 is held at 0 Volts. Within non-selected rows 1-11, the associated n-source drivers are also controlled to pull the associated n-source bias voltages down to the $V_{SS}$ supply voltage.

Pass gate driver 225 is controlled to route the $V_{DD}$ supply voltage as the select signal SEL[0]. Thus, pass gate transistors 380 and 381 are turned on, thereby coupling node A of compact flash memory cell 200 to the input terminal of inverter 180. Within the non-selected rows 1-11, the associated pass gate drivers are controlled to provide the $V_{SS}$ supply voltage as the select signals SEL[1:11].

Under these conditions, the data value provided to the input terminal of inverter 180 is determined by the programmed/erased state of floating gate 330. If floating gate 330 is programmed (i.e., stores a net negative charge), then p-channel FET device 310 is turned on (and n-channel FET device 320 is turned off) despite the logic high state of the word line signal WL[0]. As a result, the input to inverter 180 is pulled up to a logic high state through turned on p-channel FET device 310 and p-channel transistors 362-363. In response, inverter 180 provides a logic low output data signal, DQ[0].

Conversely, when floating gate 330 is erased (i.e., stores a neutral or net positive charge), n-channel FET device 320 is turned on (and p-channel FET device 310 is turned off) in response to the logic high state of the word line signal WL[0]. As a result, the input to inverter 180 is pulled to a logic low state through turned on n-channel FET device 320. In response, inverter 180 provides a logic high output data signal DQ[0]. In the same manner, inverters 181-195 provide output data signals DQ[1:15] in response to the programmed/erased states of compact flash memory cells 201-215.

Figure 4:
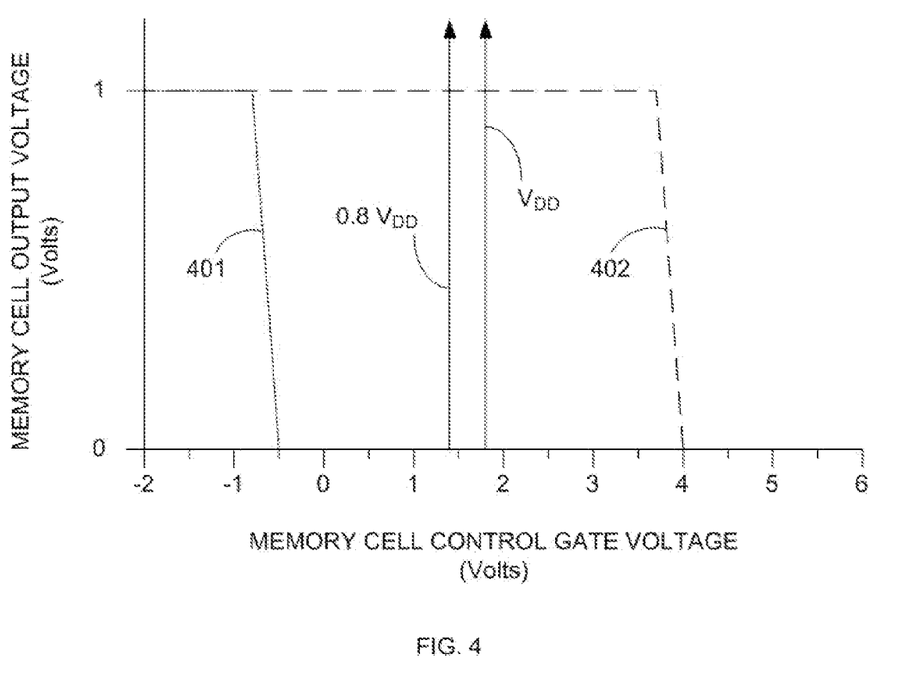
FIG. 4 is a graph illustrating the threshold voltages of programmed and erased compact flash memory cells in accordance with one embodiment of the present invention.

FIG. 4 is a graph 400 illustrating the threshold voltage of the inverter formed by compact flash memory cell 200 in an erased state and in a programmed state. If the control gate voltage is less than the threshold voltage, then compact flash memory cell 200 will provide an output signal having a logic high state. Conversely, if the control gate voltage is greater than the threshold voltage, then compact flash memory cell 200 will provide an output signal having a logic low state.

In the erased state, which is illustrated by line 401, the threshold voltage of the inverter in compact flash memory cell 200 is about −0.5 Volts. Thus, a control gate voltage equal to the $V_{DD}$ supply voltage of 1.8 Volts will cause compact flash memory cell 200 to provide a logic low output signal, floating gate 330 will have a potential of $0.8V_{DD}$ as seen in FIG. 4. Advantageously, a relatively large voltage margin exists between the erased threshold voltage and the $V_{DD}$ supply voltage.

In the programmed state, which is illustrated by line 402, the threshold voltage of the inverter in compact flash memory cell 200 is about 4 Volts. Thus, a control gate voltage equal to the $V_{DD}$ supply voltage of 1.8 Volts will cause compact flash memory cell 200 to provide a logic high output signal. Advantageously, a relatively large voltage margin exists between the programmed threshold voltage and the $V_{DD}$ supply voltage.

The compact flash memory cells in the non-selected rows 1-11 are decoupled from inverters 180-195 in response to the logic low SEL[1:11] signals. Power consumption within NMV module 100 is reduced by leaving the p-source regions of the compact flash memory cells in non-selected rows in a floating state during a read operation. In the described embodiment, NVM module 100 exhibits a 0.5 microsecond maximum read access time for a 16-bit read operation. The active read current is about 1.6 μA at 1.2 Volts and a temperature of 25° C. (Standby current is about 100 nA at 1.2 Volts and 25° C.). It is expected that NVM module 100 may perform at least 10e10 read cycles.

The standby mode within NVM module 100 is identical to the read mode. Thus, one of NVM rows 0-11 is always in an 'active' read state in the standby mode, while the remaining eleven rows will be in the condition described above for the non-selected rows during the read operation. The only difference between these rows is that in the non-selected rows, the associated switched data values SD are floating and the associated select signals SEL are equal to 0 Volts, while in the 'active' row, the associated switched data value SD is $V_{DD}$, and the associated select signal SEL is equal to $V_{DD}$.

Although the present invention has been described in connection with various embodiments, it is understood that variations of these embodiments would be obvious to one of ordinary skill in the art. Thus, the present invention is limited only by the following claims.

I claim:

1. A non-volatile memory (NVM) module comprising:
an array of compact flash memory cells arranged in rows and columns, wherein each of the compact flash memory cells comprises a p-channel field effect transistor (FET) device and an n-channel FET device arranged in an inverter configuration, wherein the p-channel FET device and the n-channel FET device share a common floating gate;
a power switch circuit including a first charge pump circuit configured to generate a positive boosted voltage, more positive than a positive supply voltage, and a second charge pump circuit configured to generate a negative boosted voltage, more negative than a ground supply voltage; and
a control circuit configured to enable the one or more charge pump circuits to program or erase one or more of the compact flash memory cells, and further configured to disable the one or more charge pump circuits to read one or more of the compact flash memory cells.

2. The NVM module of claim 1, further comprising a plurality of row driver circuits, each coupled to a corresponding row of the array, and each configured to route the positive boosted voltage and the negative boosted voltage to the corresponding row of the array during program and erase operations of the corresponding row of the array.

3. The NVM module of claim 2, wherein each of the row driver circuits is further configured to route only the positive supply voltage and the ground supply voltage to the corresponding row of the array during a read operation.

4. The NVM module of claim 2, wherein each of the row driver circuits is further configured to route only the positive supply voltage and the ground supply voltage to the corresponding row of the array during program and erase operations of rows other than the corresponding row.

5. The NVM module of claim 1, further comprising a plurality of switches, each configured to selectively route or not route the negative boosted voltage to the p-channel FET device of a corresponding compact flash memory cell during a program operation.

6. The NVM module of claim 5, further comprising a plurality of switch control circuits, each configured to provide a latched data signal that controls the switches in a corresponding column of the array.

7. The NVM module of claim 1, further comprising:
a plurality of pass gates, each coupled to a corresponding compact flash memory cell of the array; and
a plurality of output drivers, each coupled to the pass gates in a corresponding column of the array.

8. The NVM module of claim 7, wherein each of the output drivers comprises an inverter.

9. The NVM module of claim 1, further comprising an address latch configured to store a row address of a current access to the array.

10. The NVM module of claim 1, wherein the p-channel FET device and the n-channel FET device of each compact flash memory cell have commonly connected drain regions, and wherein each of the n-channel FET devices in a corresponding row of the array has a source connected to a common signal line.

11. The NVM module of claim 10, wherein the p-channel FET devices in each row of the array are fabricated in a common n-well region.

12. The NVM module of claim 10, wherein the p-channel FET devices in each row of the compact flash memory cells are fabricated in a common n-well region.

13. A method of operating a non-volatile memory (NVM) module including an array of compact flash memory cells arranged in rows and columns, wherein each of the compact flash memory cells comprises a p-channel field effect transistor (FET) device and an n-channel FET device arranged in an inverter configuration, and wherein the p-channel FET device and the n-channel FET device share a common floating gate, the method comprising:
identifying an access to the NVM module as a program operation, an erase operation or a read operation;
if an access is identified as a program operation or an erase operation, then generating a positive boosted voltage, more positive than a positive supply voltage and generating a negative boosted voltage, more negative than a ground supply voltage, and using the positive boosted voltage and the negative boosted voltage to implement the program operation or the erase operation; and
suppressing the generation of the positive boosted voltage and the negative boosted voltage if an access is identified as a read operation, and using the positive supply voltage and the ground supply voltage to implement the read operation.

14. The method of claim 13, further comprising routing the positive boosted voltage and the negative boosted voltage to a row of the array if the access is identified as a program operation or erase operation to the row of the array.

15. The method of claim 14, applying only the positive supply voltage and the ground supply voltage to row of the array if the access is identified as a read operation.

16. The method of claim 13, further comprising selectively routing or not routing the negative boosted voltage to the p-channel FET device of a corresponding compact flash memory cell if the access is identified as a program operation.

17. The method of claim 16, further comprising selectively routing or not routing in response to a latched data signal.

18. The method of claim 13, further comprising coupling the compact flash memory cells of a selected row to a corresponding set of output drivers if the access is identified as a read operation.

19. The method of claim 13, further comprising applying a dedicated source bias signal to each row of the array, wherein each dedicated source bias signal is applied to a source of each n-channel FET device in a corresponding row of the array.

20. The method of claim 19, further comprising applying a dedicated n-well bias signal to each row of the array, wherein each dedicated n-well bias signal is applied to an n-well region of each p-channel FET device in a corresponding row of the array.

21. A non-volatile memory (NVM) module comprising:
an array of compact flash memory cells arranged in rows and columns, wherein each of the compact flash memory cells comprises a p-channel field effect transistor (FET) device and an n-channel FET device, wherein the p-channel FET device and the n-channel FET device share a common floating gate and have commonly connected drain regions, and wherein each of the n-channel FET devices in a corresponding row of the compact flash memory cells has source connected to a common signal line;
a power switch circuit including one or more charge pump circuits for generating one or more boosted voltages in response to one or more supply voltages; and
a control circuit configured to enable the one or more charge pump circuits to program or erase one or more of the compact flash memory cells, and further configured to disable the one or more charge pump circuits to read one or more of the compact flash memory cells.

* * * * *